United States Patent [19]
Alini et al.

[11] Patent Number: 5,495,201
[45] Date of Patent: Feb. 27, 1996

[54] TRANSCONDUCTOR STAGE

[75] Inventors: Roberto Alini, Stradella; Maurizio Zuffada, Milan; David Moloney, Cornaredo; Silvano Gornati, Casorezzo, all of Italy

[73] Assignee: SGS Thomson Microelectronics, S.r.l., Agrate Briaz, Italy

[21] Appl. No.: 145,989

[22] Filed: Oct. 29, 1993

[51] Int. Cl.6 .................................................. G06G 7/12
[52] U.S. Cl. ............................................ 327/563; 330/252
[58] Field of Search ........................................ 307/350, 364, 307/494, 495, 497, 520, 529; 328/146, 147, 148, 149, 158; 330/149, 252, 253, 254, 257, 259, 288; 327/2, 39, 50, 55, 65, 82, 427, 432, 561, 563

[56] References Cited

U.S. PATENT DOCUMENTS

| | | | |
|---|---|---|---|
| 3,633,120 | 1/1972 | Battjes | 330/30 R |
| 4,052,679 | 10/1977 | Hosoya | 330/261 |
| 4,369,410 | 1/1983 | Fenk | 330/254 |
| 4,409,497 | 10/1983 | Nagano | 307/360 |
| 4,806,792 | 2/1989 | Simmons | 307/357 |
| 4,890,067 | 12/1989 | Lamb | 330/149 |
| 5,107,150 | 4/1992 | Kimura | 307/529 |
| 5,311,088 | 5/1994 | Nelson | 307/520 |
| 5,315,261 | 5/1994 | Kimura | 328/168 |
| 5,329,189 | 7/1994 | Ushida et al. | 307/529 |
| 5,331,289 | 7/1994 | Price | 330/252 |
| 5,332,937 | 7/1994 | Castello et al. | 307/520 |

FOREIGN PATENT DOCUMENTS

| | | |
|---|---|---|
| 0380152 | 8/1990 | European Pat. Off. . |
| 2462817 | 6/1980 | France . |
| 2195211 | 3/1988 | United Kingdom . |

*Primary Examiner*—Timothy P. Callahan
*Assistant Examiner*—Jeffrey Zweizig
*Attorney, Agent, or Firm*—Robert Groover; Betty Formby

[57] ABSTRACT

A transconductor stage for high-frequency filters operated on a low voltage supply, being of a type which comprises an input circuit portion having signal inputs, further comprises a pair of interconnected differential cells (2,3) being associated each with a corresponding signal input. Each cell incorporates at least one pair of bipolar transistors (Q1, Q2;Q3,Q4) having at least one corresponding terminal thereof (e.g. the emitter terminal) connected in common.

57 Claims, 3 Drawing Sheets

TRANSCONDUCTOR STAGE

CROSS-REFERENCE TO RELATED APPLICATION

This application claims priority from EPC App'n 992830602.6, filed OCT. 30, 1992, which is hereby incorporated by reference.

BACKGROUND AND SUMMARY OF THE INVENTION

This invention relates to an improved transconductor stage which includes an input circuit portion having signal inputs.

The field of application of this invention is particularly, but not solely, related to monolithically integrated time-continuous filters, and the description to follow will make reference to that field of application for convenience of illustration.

As is known, a number of techniques for providing time-continuous integrated filters have been proposed. Among them, those which appear at present to perform best in high frequency environments utilize a transconductor stage as the filter basic block. Most likely, this is attributable to the voltage-to-current conversion being carried out in an open loop within the transconductor, and to the so-called non-dominant pole of the converter not being limited by the frequency unitary gain of the amplification.

In any case, the performance features which are usually expected of a transconductor stage, for high-frequency applications, are basically the following:

maximum amplitude of the signal to be processed;

low noise generation:

low biasing consumption;

high transconductance (gm) value;

high dynamic range of transconductance (gm); and high gain, in excess of 50 dB.

The prior art has already provided a transconductor stage design which has good performance features closely approximating the above target features. Reference is directed in particular to a transconductor described in Italian Patent Application No. MI91A 003018 by this Applicant.

That Application discloses a transconductance amplifier provided in a mixed bipolar/MOS technology and comprising an input circuit portion having a differential cell with a pair of source-sharing MOS transistors which are connected to an output circuit portion comprising a pair of base-sharing bipolar transistors.

While being in many ways advantageous and substantially achieving its objective, this prior solution has a drawback in that high transconductance values cannot be obtained concurrently with a low current draw and good linearity.

In addition, this prior solution is unsuitable for operation at low power supply values, e.g. of no more than 3 Volts.

A demand definitely exists at present for analog circuits which can operate on just 3 Volts: and yet afford comparable performance levels to circuits operated on 5 Volts. Some solutions have been proposed in the prior art which would seemingly operate even on supply voltages close to 3 Volts; however, under such operating conditions, these solutions have proved ineffective to ensure control of the transconductance gm value over a sufficiently wide range.

The underlying technical problem of this invention is, therefore, that of providing a transconductor stage which has such structural and functional features as to overcome the above-noted drawbacks of prior art solutions.

The present application provides a low-voltage transconductor with two separate differential cells having separate current bias connections. One side of each differential cell is connected to receive an input signal, and the other sides of the two cells have control terminals connected together.. Each cell is connected to both outputs of the transconductor stage.

According to innovative teachings disclosed herein, thereis provided: An integrated circuit transconductor stage, connected to receive power supply voltages which differ by less than 4.5 Volts comprising: first and second differential cells, each comprising first and second transistors having respective first current-carrying terminals thereof connected in common, and a respective current generator connected to provide a fixed current to the connection of said first current-carrying terminals; each said first transistor having a respective control terminal connected to provide a respective input connection; both said second transistors having respective control terminals thereof connected together; said first transistor of said first cell, and said second transistor of said second cell, having respective second current-carrying terminals thereof jointly connected to provide a first current output; and said: second transistor of said first cell, and said first transistor of said second cell, having respective second current-carrying terminals thereof jointly connected to provide a second current output; whereby said outputs provide a differential signal which generally corresponds to the difference in voltage between said input connections.

According to innovative teachings disclosed herein, thereis provided: An integrated circuit transconductor stage, comprising: first and second differential cells, each comprising first and second transistors having respective i first current-carrying terminals thereof connected in common, and a respective current generator connected to provide a fixed current to the connection of said first current-carrying terminals; each said first transistor having a respective control terminal connected to provide a respective input connection; both said second transistors having respective control terminals thereof connected together; said first transistor of said first cell, and said second transistor of said second cell, having respective second current-carrying terminals thereof jointly connected to provide a first current output; and said second transistor of said first cell, and said first transistor of said second cell, having respective second current-carrying terminals thereof jointly connected to provide ,a second current output; and further comprising a low-pass biasing network connected to bias said control terminals of said second transistors to the long-term average value of said control terminals of said first transistors; whereby said first and second outputs provide a differential signal which generally corresponds to the difference in voltage between said input connections.

According to innovative teachings disclosed herein, thereis provided: An integrated circuit transconductor stage, comprising: first and second differential cells, each comprising first and second transistors having respective first current-carrying terminals thereof connected in common, said second transistors having device dimensions which provide higher gain than said first transistors; and a respective current generator connected to provide a fixed current to the connection of said first current-carrying terminals; each said first transistor having a respective control terminal connected to provide a respective input connection; both said second transistors having respective control terminals thereof jointly connected to a variable bias current supply which provides a variable bias current to dynamically adjust the transconductance of said stage; said first transistor of said first cell, and said second transistor of said second cell, having respective second current-carrying terminals thereof jointly connected to provide a first current output; and said second transistor of said first cell, and said first transistor of said second cell, having respective second current-carrying terminals thereof jointly connected to provide a second current output; whereby said outputs provide a differential signal which generally corresponds to the difference in voltage between said input connections.

According to innovative teachings disclosed herein, thereis provided: An integrated circuit transconductor stage for high-frequency filters operated on a low voltage supply, comprising: an input circuit portion having signal inputs; and a pair of differential cells being connected together and each associated with a corresponding signal input, each said cell incorporating at least one pair of transistors having at least a corresponding current-carrying terminal in common; each said cell comprising a respective current generator connected to provide a fixed current to said common terminal.

According to innovative teachings disclosed herein, thereis provided: An analog filter circuit, comprising: a differential input stage, a differential output stage, and one or more additional differential stages, each comprising: first and second differential cells, each comprising first and second transistors having respective first current-carrying terminals thereof connected in common, and a respective current generator connected to provide a fixed current to the connection of said first current-carrying terminals; each said first transistor having a respective control terminal connected to provide a respective input connection; both said second transistors having respective control terminals thereof connected together and to a biasing circuit; said first transistor of said first cell, and said second transistor of said second cell, having respective second current-carrying terminals thereof jointly connected to provide a first current output; and said second transistor of said first cell, and said first transistor of said second cell, having respective second current-carrying terminals thereof jointly connected to provide a second current output; said stages being connected together, with one or more passive elements, in a circuit relationship to implement a desired continuous-time filter relationship from said input connections of said input stage to said outputs of said output stage.

The features and advantages of a transconductor stage according to the invention can be more clearly understood from the following detailed description of an embodiment thereof, given by way of example and not of limitation with reference to the accompanying drawings.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

Figure 1:
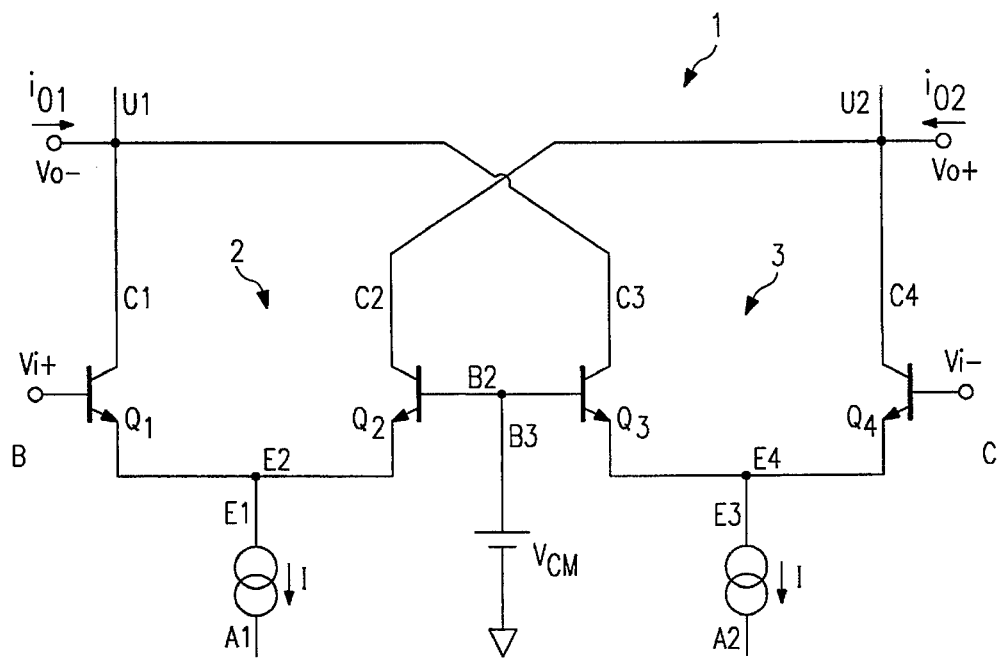
FIG. 1 is diagrammatic representation of a transconductor stage according to the invention.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

With reference to the drawing views, shown in diagrammatic form at 1 is a transconductor stage embodying this invention for processing high-frequency, higher than 50 MHz, analog signals while operating on a low voltage supply Vd.

The stage 1, which has been depicted in a simplified form, is preferably provided in the bipolar technology. It would be equally possible, however, to provide it in a mixed technology, that is by having both bipolar and MOS transistors incorporated.

The stage 1 includes signal inputs, indicated at B and C, being each associated with a respective differential cell 2, 3.

The inputs B and C are applied corresponding voltage signals Vi+ and Vi−; the differential voltage Vin at the stage 1 input is given by the difference (Vi+−Vi−) between said input signals.

The first cell 2 comprises a first pair of bipolar transistors Q1, Q2 of the npn type having their respective emitter terminals E1, E2 in common to form a circuit node at which a constant bias current I is made available by means of a generator A1.

The second cell 3 comprises a second pair of bipolar transistors Q3, Q4 of the npn type having their respective emitter terminals E3, E4 in common to form a second circuit node at which a constant current I is made available by means of a generator A2.

The transistors Q1 and Q4 have equal minimum emitter areas.

The transistors Q2 and Q3, while being the same size, have a larger area than the former transistors, Q1 and Q4. Specifically, the area of transistors Q2, Q3 is et times that of transistors Q1, Q4, and the value of α lies preferably between four and six.

The cells 2 and 3 are connected to each other through their respective transistors.

More particularly, the transistors Q2 and Q3 have their respective bases B2 and B3 in common and connected to ground via a constant voltage Vcm generator, such as a battery.

The voltage Vcm is called common mode voltage and intended for maintaining the bases B2 and B3 at a common bias value.

The collector C1 of the first transistor Q1 in the first pair of transistors Q1, Q2 and the collector C4 of the second transistor in the second pair of transistors Q3 and Q4 are the outputs U1, U2 of the stage 1 wherethrough flow differential currents $i_{o1}$ and $i_{o2}$.

The collectors C2, C3 of the second transistor Q2 in the first pair and the first transistor Q3 in the second pair are connected to the second output U2 and the first output U1, respectively.

The two cells 2 and 3 are therefore connected to each other in a substantially crossover fashion.

The operation of the transconductor stage 1 according to the invention will now be described. An exemplary application thereof will be discussed later herein.

The stage 1 biasing within the linear operation region of the transistors Q1, ... Q4, to enable proper voltage-to-current linear conversion is ensured by suitably selecting the value for the bias current I. Using the well-known Ebers-Moll's equations, the operation of the inventive circuit can be described mathematically.

For large signals, the transconductance gm value can be defined by the following relationship:

$$gm = \left( \frac{I}{V_T} \right) \left[ \alpha e^x \frac{(\alpha^2 + 1)e^{2x} + 4\alpha e^x + (\alpha^2 + 1)}{(\alpha + e^x)^2 (\alpha e^x + 1)^2} \right] \quad (1)$$

where VT is the voltage equivalent of the absolute temperature (VT = 25 mV at 27° C.), I is the bias current, α is the area of the transistors Q2 and Q3, and x=½(Vin/VT).

From equation (1), the transconductance $gm_o$ value for small signals, i.e. with Vin<<1, can be obtained as follows:

$$gm_o = \left( \frac{1}{V_T} \right) \left[ \frac{2\alpha}{(\alpha + 1)^2} \right] \quad (2)$$

This equation (2) only holds, in fact, for small differential signals, but does bring out Me dependence of the value of $gm_o$ on the bias current $I_B$. By changing the value of that current, the transconductance $gm_o$ value can be adjusted within a fairly wide range, e.g. of 1 to 10.

The operational linearity of the stage 1 is instead adjusted by selecting the α parameter (the area of transistors Q2 and Q3).

Actual tests and simulations conducted on the basis of equation (1) show that, for a value of α equal to 5.2, the signal harmonic skew can be kept quite small and close to 1% with input signals having an amplitude of 300 mV. This skewing remains small throughout the range of practicable values of bias current $I_B$.

Additionally, the aforesaid value of the a parameter has proved to be non-critical since, for ,variations in the 5 to 5.4 range, the skewing remains at all times close to 1%, when Vin=300mV.

The circuit of this invention is useful in high-frequency environments on account of its simple structure and because it incorporates bipolar transistors.

Understandably, it matters to the proper operation of the stage 1 that the manufacturing technology can provide npn bipolar transistors having a low base resistance, high transition (cutoff) frequency $f_T$, and low time constant as given by the product of the collector resistance by the collector/substrate capacitance. These constructional features ensure good speed for the circuit 1.

A second embodiment of the circuit shown in FIG. 1 will now be discussed with specific reference to FIG. 2, in which co-operating parts and details having similar structure and operation to the previously discussed embodiment are denoted by the same reference numerals.

Figure 2:
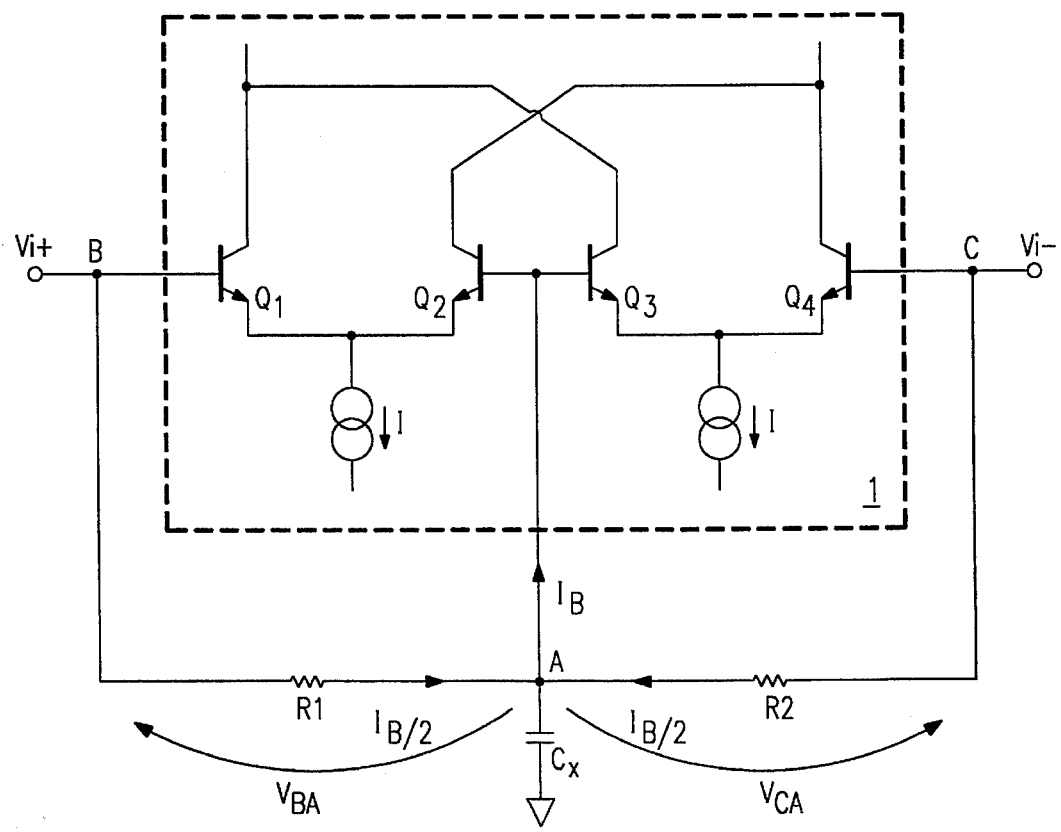
FIG. 2 is a diagrammatic representation of a second embodiment of the transconductor stage in FIG. 1.

In the diagram of FIG. 2, a first resistor R1 is connected between the respective bases B1 and B2 of transistors Q1 and Q2 in the first cell 2, while a second resistor R2 is connected between the respective bases B3 and B4 of transistors Q3 and Q4 in the second cell 3.

Connected between said resistors R1, R2 and ground is a capacitor Cx. The connection point between the resistors and the capacitor Cx is marked as node A.

Preferably, the resistors R1, R2 are the same value of 5 kΩ, and that of the capacitor Cx is 5 pF.

According to the diagram of FIG. 2, the bases B1 and B4 of the input transistors Q1, Q4 are forward biased by the signal from a preceding stage, that is a stage connected ahead of stage 1 in the direction of signal propagation.

Further, it is assumed that the bias voltage provided by the stage ahead is equivalent to the common mode voltage Vcm that was provided by the battery E in the previous embodiment.

On the other hand, the base voltage of the remaining transistors Q2 and Q3 is obtained from the voltage drop across the resistors R1 and R2. Assuming the current Ib which flows from the node A to the bases B2, B3 to be null, then the node A will attain a voltage exactly equal to Vcm, thereby duly biasing the stage 1. The capacitor Cx will, moreover, function as a filter for any high-frequency signals present at the node A.

Actually, the current Ib ;drawn by the transistors Q2, Q3 will be definitely other than zero: it will be a function of the collector current of said transistors, as well as of the temperature and the variables of the technological process.

In essence, the current Ib generates a voltage offset between the inputs B, C and the node A; accordingly, this current will have a second-order effect on the linearity of the transconductor stage.

The voltage offset is represented by the voltage drop $V_{BA}$, being identical with the voltage drop $V_{CA}$ and equal to R*Ib/2.

Figure 3:
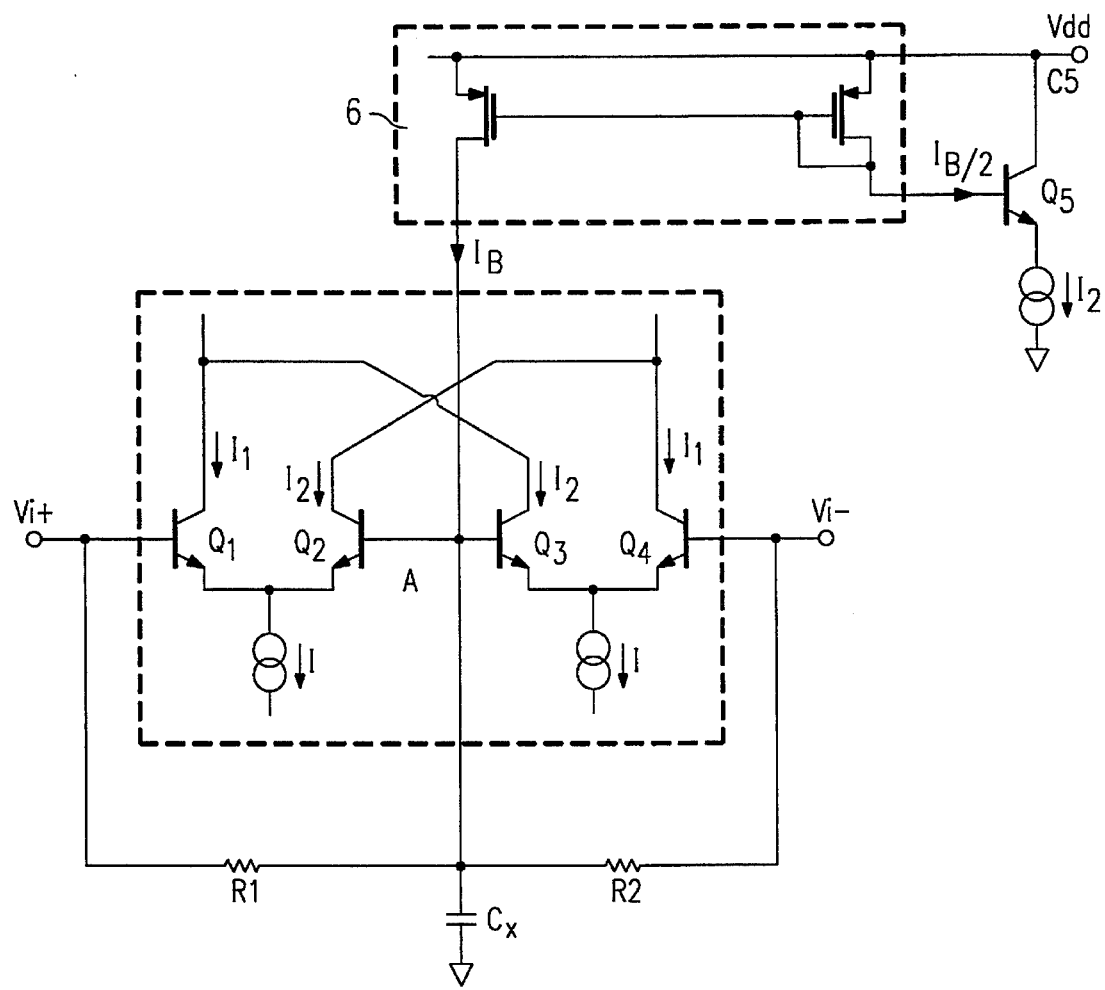
FIG. 3 is a further diagrammatic view showing in greater detail the transconductor in FIG. 2.

In order to obviate any problem from the presence of the voltage offset, the solution shown in FIG. 3 is provided which may be regarded as an option for the stage 1.

A bipolar transistor Q5 of the npn type is connected between the voltage supply Vd and ground, with the collector C5 being connected to the voltage supply and the emitter E5 connected to ground via a current generator I2.

This transistor Q5 is selected to have the same area as the transistors Q2 and Q3; in addition, the current I2 on the collector C5 is equal to the collector current of those same transistors Q2 and Q3.

The base B5 of the transistor Q5 draws a current which is Ib/2. Advantageously, a current mirror 6 is connected between the base B5 of the transistor Q5 and the node A. In a preferred embodiment, the current mirror 6 comprises a pair of P-channel MOS transistors.

The current mirror 6 is balanced to provide a multiplication ratio of two.

Thus, the node A will be supplied, through the mirror circuit 6, a current equal to Ib/2 multiplied by two, and hence identical with Ib. This fully compensates for the voltage offset.

Therefore, with this solution as illustrated by FIG. 3, the current at the resistors R1, R2 will disappear and the offset phenomenon be suppressed.

An exemplary application of the transconductor stage according to the invention will now be described.

Figure 4:
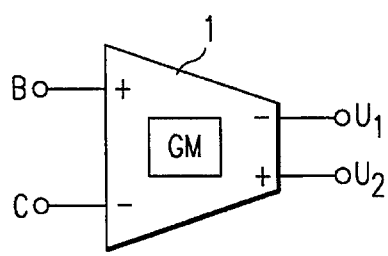
FIG. 4 is a diagrammatic view of the transconductor stage of this invention.
Figure 5:
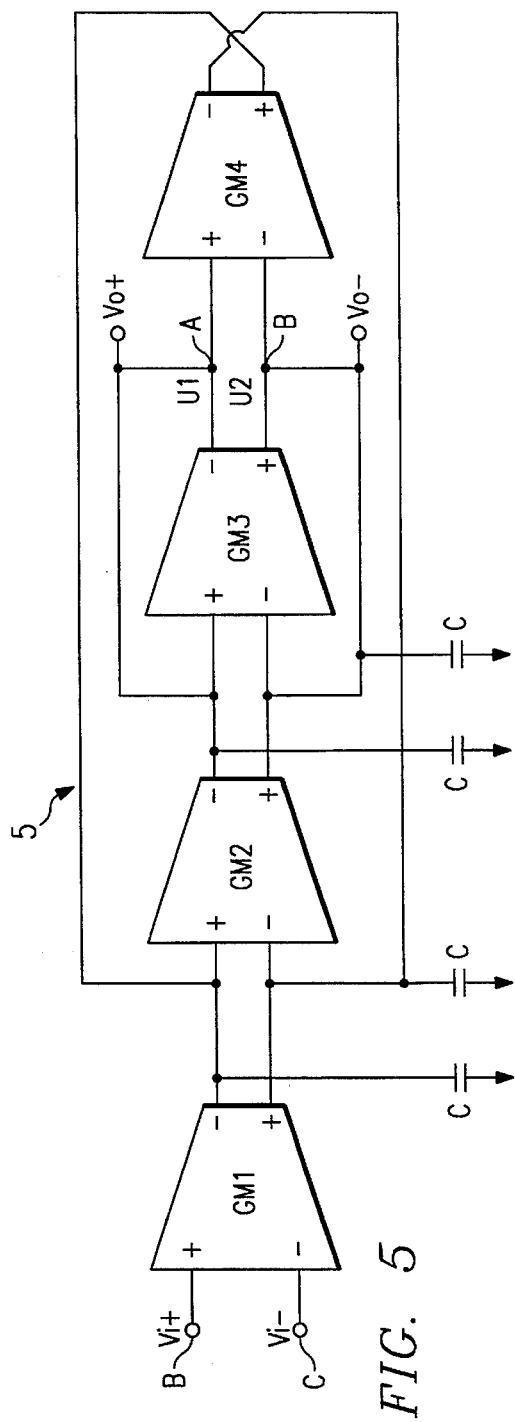
FIGS. 5 and 6 are diagrammatic views of respective examples of time-continuous filters incorporating the transconductor stage of this invention.

In FIG. 4, the stage 1 is depicted in a highly schematic form that only purports to illustrate it generally. FIG. 5, using the basic diagram of FIG. 4, shows an example of a time-continuous low-pass filter 5 incorporating a number of transconductor differential stages embodying this invention and being denoted by the acronyms GM1, GM2, GM3, GM4.

The filter 5 may be integrated monolithically and is specifically conceived for very high-frequency, above 50 MHz, applications.

This filter 5 is a second-order filter, comprising a so-called bi-quadratic cell. The stages are cascade-connected together, with the outputs of one stage being connected to the respective inputs B, C of the stage next after. In accordance with very familiar principles of analog filter design, the values of the passive components can be adjusted to achieve the desired frequency response characteristics. Similarly, the connections of the active stages can be changed, and/or more stages can be added, and/or the gains of the different active stages can be separately adjusted.

Advantageously, the outputs of the fourth stage are feedback connected, and in a crossover fashion to the inputs of the second stage, while the outputs of the third stage are feedback connected to the inputs of the third stage itself.

Capacitive couplings are also provided between the outputs of the first two stages and ground.

The filter 5 shown is specially effective where the dynamic range of the input signal is less than 300 mV peak-to-peak.

With higher dynamic ranges, the use of buffer circuits 4 has shown to effectively avoid signal skewing.

Figure 6:
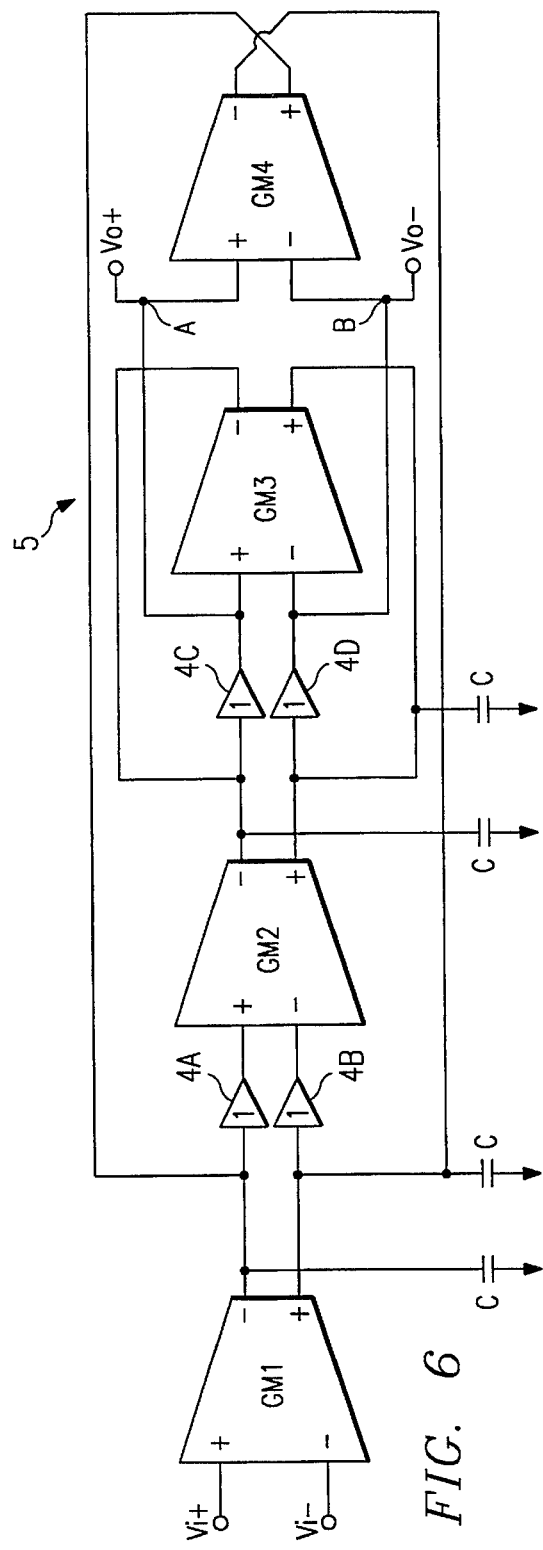

Shown in FIG. 6 is an exemplary application wherein unitary gain buffers 4A through 4D have been incorporated to the filter 5, ahead of the signal inputs of the second and third filter stages.

The transconductor stage of this invention does solve the technical problem and affords a number of advantages, foremost among which is, of course, its ability to process large signals in a linear fashion.

The solution provided 2 by the invention also allows the transconductance gm value to be changed within a sufficiently wide range while operating with a voltage supply of 3 Volts only. The transconductance gm value is of about 2 mA/V with an overall bias current of 400 µA.

The transconductor of this invention is characterized by having a parasitic pole at higher frequencies than 2 GHz with a gain close to 50 dB.

Understandably, this solution may be altered and modified in several ways within the invention scope as set forth in the appended claims.

Further Modifications and, Variations

It will be recognized by those skilled in the art that the innovative concepts disclosed in;the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit transconductor stage, connected to receive power supply voltages which differ by less than 4.5 Volts, comprising:

first and second differential cells, each comprising first and second transistors having respective first current-carrying terminals thereof connected in common, and a respective current generator connected to provide a fixed current to the connection of said first current-carrying terminals;

each said first transistor having a respective control terminal connected to provide a respective input connection;

both said second transistors having respective control terminals thereof connected together;

wherein said second transistors have device dimensions which provide higher gain than said first transistors;

said first transistor of said first cell, and said second transistor of said second cell, having ,respective second current-carrying terminals thereof jointly connected to provide a first current output; and said second transistor of said first cell, and said first transistor of said second cell, having respective second current-carrying terminals thereof jointly connected to provide a second current output;

whereby said outputs provide a differential signal which generally corresponds to the difference in voltage between said input connections.

2. The integrated circuit of claim 1, wherein said transistors are bipolar transistors.

3. The integrated circuit of claim 1, wherein each said output is connected through a respective load element to a power supply connection.

4. The integrated circuit of claim 1, wherein said transistors are npn bipolar transistors.

5. The integrated circuit of claim 1, wherein said transistors are bipolar transistors, and said first current-carrying terminals thereof are emitter terminals, and said second current-carrying terminals thereof are collector terminals.

6. The integrated circuit of claim 1, wherein said transistors are field-effect transistors, and said first current-carrying terminals thereof are source terminals, and said second current-carrying terminals thereof are drain terminals.

7. The integrated circuit of claim 1, wherein said first and said second transistors are bipolar transistors and said second transistors have emitter area which is larger than an emitter area of said first transistors.

8. The integrated circuit of claim 1, wherein said second transistors have device dimensions which provide gain which is more than 3 times greater than that of said first transistors.

9. The integrated circuit of claim 1, wherein said second transistors have device dimensions which provide gain which is about 5 times greater than that of said first transistors.

10. The integrated circuit of claim 1, wherein a first resistor is connected between said respective control terminals of said first and second transistors in said first cell, and a second resistor is connected between said respective control terminals of said first and second transistors in said second cell.

11. The integrated circuit of claim 1, further comprising a capacitance connected from a constant potential to said control terminals of said second transistors.

12. The integrated circuit of claim 1, further comprising a bias current supply connected to provide bias current to said control terminals of said second transistors.

13. The integrated circuit of claim 1, wherein said second transistors have device dimensions which provide higher gain than said first transistors; and further comprising a variable bias current supply connected to provide a variable bias current to said control terminals of said second transistors to dynamically adjust the transconductance of said stage.

14. An integrated circuit transconductor stage, comprising:
   first and second differential cells, each comprising
      first and second transistors having respective first current-carrying terminals thereof connected in common, and
      a respective current generator connected to provide a fixed current to the connection of said first current-carrying terminals;
   each said first transistor having a respective control terminal connected to provide a respective input connection;
   both said second transistors having respective control terminals thereof connected together;
   wherein said second transistors have device dimensions which provide higher gain than said first transistors;
   said first transistor of said first cell, and said second transistor of said second cell, having respective second current-carrying terminals thereof jointly connected to provide a first current output; and said second transistor of said first cell, and said first transistor of said second cell having respective second current-carrying terminals thereof jointly connected to provide a second current output;
   and further comprising a low-pass biasing network connected to bias said control terminals of said second transistors to the long-term average value of said control terminals of said first transistors;
   whereby said first and second outputs provide a differential signal which generally corresponds to the difference in voltage between said input connections.

15. The integrated circuit of claim 14, wherein said transistors are bipolar transistors.

16. The integrated circuit of claim 14, wherein each said output is connected through a respective load element to a power supply connection.

17. The integrated circuit of claim 14, wherein said transistors are npn bipolar transistors.

18. The integrated circuit of claim 14, wherein said transistors are bipolar transistors, and said first current-carrying terminals thereof are emitter terminals, and said second current-carrying terminals thereof are collector terminals.

19. The integrated circuit of claim 14, wherein said transistors are field-effect transistors, and said first current-carrying terminals thereof are source terminals, and said second current-carrying terminals thereof are drain terminals.

20. The integrated circuit of claim 14, wherein said first and said second transistors are bipolar transistors and said second transistors have an emitter area which is larger than an emitter area of said first transistors.

21. The integrated circuit of claim 14, wherein said second transistors have device dimensions which provide gain which is more than 3 times greater than that of said first transistors.

22. The integrated circuit of claim 14, wherein said second transistors have device dimensions which provide gain which is about 5 times greater than that of said first transistors.

23. The integrated circuit of claim 14, wherein a first resistor is connected between said respective control terminals of said first and second transistors in said first cell, and a second resistor is connected between said respective control terminals of said first and second transistors in said second cell, 24. The integrated circuit of claim 14, further comprising a capacitance connected from a constant potential to said control terminals of said second transistors.

25. The integrated circuit of claim 14, further comprising a bias current supply connected to provide bias current to said control terminals of said second transistors.

26. The integrated circuit of claim 14, wherein said second transistors have device dimensions which provide higher gain than said first transistors; and further comprising a variable bias current supply connected to provide a variable bias current to said control terminals of said second transistors to dynamically adjust the transconductance of said stage.

27. An integrated circuit transconductor stage, comprising:
   first and second differential cells, each comprising
      first and second transistors having respective first current-carrying terminals thereof connected in common, said second transistors having device dimensions which provide higher gain than said first transistors; and
      a respective current generator connected to provide a fixed current to the connection of said first current-carrying terminals;
   wherein said second transistors have device dimensions which provide higher gain than said first transistors;
   each said first transistor having a respective control terminal connected to provide a respective input connection;
   both said second transistors having respective control terminals thereof jointly connected to a variable bias current supply which provides a variable bias current to dynamically adjust the transconductance of said stage;
   said first transistor of said first cell, and said second transistor of said second cell, having respective second current-carrying terminals thereof jointly connected to provide a first current output; and said second transistor of said first cell, and said first transistor of said second cell, having respective second current-carrying terminals thereof jointly connected to provide a second current output;
   whereby said outputs provide a differential signal which generally corresponds to the difference in voltage between said input connections.

28. The integrated circuit of claim 27, wherein said transistors are bipolar transistors.

29. The integrated circuit of claim 27, wherein each said output is connected through a respective load element to a power supply connection.

30. The integrated circuit of claim 27, wherein said transistors are npn bipolar transistors.

31. The integrated circuit of claim 27, wherein said transistors are bipolar transistors, and said first current-carrying terminals thereof are emitter terminals, and 2said second current-carrying terminals thereof are collector terminals.

32. The integrated circuit of claim 27, wherein said transistors are field-effect transistors, and said first current-carrying terminals thereof are source terminals, and said second current-carrying terminals thereof are drain terminals.

33. The integrated circuit of claim 27, wherein said second transistors have device dimensions which provide gain which is more than 3 times greater than that of said first transistors.

34. The integrated circuit of claim 27, wherein said second transistors have device dimensions which provide gain which is about 5 times greater than that of said first transistors.

35. The integrated circuit of claim 27, wherein a first resistor is connected between said respective control terminals of said first and second transistors in said first cell, and a second resistor is connected between said respective control terminals of said first and second transistors in said second cell.

36. The integrated circuit of claim 27, further comprising a capacitance connected from a constant potential to said control terminals of said second transistors.

37. The integrated circuit of claim 27, further comprising a bias current supply connected to provide bias current to said control terminals of said second transistors.

38. An integrated circuit transconductor stage for high-frequency filters operated on a low voltage supply, comprising:
   an input circuit portion having signal inputs; and
   a pair of differential cells: being connected together and each associated with a corresponding signal input,
   each said cell incorporating at least one pair of transistors having at least a corresponding current-carrying terminal in common;
   each cell comprises a minimal area transistor and a transistor with an area $\alpha$ times as large, where $\alpha > 1$;
   each said cell comprising a respective current generator connected to provide a fixed current to said common terminal.

39. The integrated circuit of claim 38, wherein said cells are connected together through at least one control terminal pair of respective ones of the transistors.

40. The integrated circuit of claim 38, wherein said transistors are bipolar transistors.

41. The integrated circuit of claim 40, wherein said transistors are npn-junction bipolar transistors.

42. The integrated circuit of claim 38, wherein said transistors are bipolar transistors, and said corresponding shared terminal is the emitter terminal.

43. The integrated circuit of claim 38, wherein said transistors are field-effect transistors, and said corresponding shared terminal is the source terminal.

44. The integrated circuit of claim 38, wherein said transistors are bipolar and each cell comprises a minimal area transistor and a transistor with an emitter area $\alpha$ times as large.

45. The integrated circuit of claim 38, wherein said transistors are bipolar transistors, and the collector of the first transistor in the first transistor pair and the collector of the second transistor in the second transistor pair are the outputs of the transconductor stage.

46. The integrated circuit of claim 45, wherein said transistors are bipolar transistors, and the collectors of the second transistor in the first pair and of the first transistor in the second pair are respectively connected to the second output and the first output of the stage.

47. The integrated circuit of claim 38, wherein a first resistor is connected between respective control terminals of said transistors in said first cell, and a second resistor is connected between respective control terminals of said transistors in said second cell.

48. The integrated circuit stage of claim 47, wherein said first and second resistors have the same value.

49. The integrated circuit stage of claim 47, wherein a capacitor is connected from a constant potential to both said resistors.

50. The integrated circuit stage of claim 47, further comprising a current mirror connected between said resistors and the control terminal of a transistor connected between the voltage supply and ground.

51. The integrated circuit stage of claim 50, wherein said current mirror is formed of insulated-gate field-effect transistors.

52. The integrated circuit stage of claim 38, wherein said transistors are insulated-gate field-effect transistors.

53. An analog filter circuit, comprising:
   a differential input stage, a differential output stage, and one or more additional differential stages, each comprising:
      first and second differential cells, each comprising
         first and second transistors having respective first current-carrying terminals thereof connected in common, and
         a respective current generator connected to provide a fixed current to the connection of said first current-carrying terminals;
      each said first transistor having a respective control terminal connected to provide a respective input connection;
      both said second transistors having respective control terminals thereof connected together and to a biasing circuit;
      said first transistor of said first cell, and said second transistor of said second cell, having respective second current-carrying terminals thereof jointly connected to provide a first current output; and said second transistor of said first cell, and said first transistor of said second cell, having respective second current-carrying terminals thereof jointly connected to provide a second current output;
   said stages being connected together, with one or more passive elements, in a circuit relationship to implement a desired continuous-time filter relationship from said input connections of said input stage to said outputs of said output stage.

54. The circuit of claim 53, wherein each said passive element is a capacitor.

55. The circuit of claim 53, wherein said circuit relationship includes at least one negative feedback loop.

56. The circuit of claim 53, wherein said circuit relationship includes at least two negative feedback loops.

57. A second-order low-pass filter circuit, comprising: at least one differential transconductor stage which comprises
   an input circuit portion having signal inputs; and
   a pair of differential cells being connected together and each associated with a corresponding signal input,
   each said cell incorporating at least one pair of transistors having at least a corresponding current-carrying terminal in common;
   each said cell comprising a respective current generator connected to provide a fixed current to said common terminal.

* * * * *